United States Patent
Wang et al.

(10) Patent No.: US 8,897,727 B2
(45) Date of Patent: Nov. 25, 2014

(54) POWER DETECTOR WITH TEMPERATURE COMPENSATION

(71) Applicant: QUALCOMM Incorporated, San Diego, CA (US)

(72) Inventors: Xinwei Wang, Dunstable, MA (US); Yongrong Zuo, Chelmsford, MA (US); Xiangdong Zhang, Westford, MA (US); Marc Gerald DiCicco, Dunstable, MA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/828,714

(22) Filed: Mar. 14, 2013

(65) Prior Publication Data

US 2013/0324062 A1 Dec. 5, 2013

Related U.S. Application Data

(60) Provisional application No. 61/654,655, filed on Jun. 1, 2012.

(51) Int. Cl.

| | |
|---|---|
| *H04B 17/00* | (2006.01) |
| *H03F 3/45* | (2006.01) |
| *G01R 21/14* | (2006.01) |
| *H03F 3/24* | (2006.01) |
| *H03G 1/04* | (2006.01) |
| *H03G 3/30* | (2006.01) |

(52) U.S. Cl.
CPC .. *H04B 17/0062* (2013.01); *H03F 2203/45292* (2013.01); *H03F 3/45183* (2013.01); *H03F 2200/456* (2013.01); *H03F 2203/45302* (2013.01); *H03F 2200/447* (2013.01); *H03G 1/04* (2013.01); *H03F 2200/453* (2013.01); *H03F 2200/465* (2013.01); *H03F 3/45188* (2013.01); *H03F 2203/45481* (2013.01); *G01R 21/14* (2013.01); *H03F 2203/45156* (2013.01); *H03F 3/245* (2013.01); *H03F 2203/45112* (2013.01); *H03G 3/3036* (2013.01)

USPC ............. 455/115.1; 455/226.1; 330/136; 330/285

(58) Field of Classification Search
USPC .......... 455/91, 115.1, 115.2, 125, 126, 127.1, 455/127.2, 127.3; 330/129, 285, 136
See application file for complete search history.

(56) References Cited

U.S. PATENT DOCUMENTS

| | | |
|---|---|---|
| 5,079,454 A | 1/1992 | Benton et al. |
| 6,531,860 B1 | 3/2003 | Zhou et al. |

(Continued)

FOREIGN PATENT DOCUMENTS

| | | |
|---|---|---|
| WO | 02103375 A2 | 12/2002 |

OTHER PUBLICATIONS

International Search Report and Written Opinion—PCT/US2013/043445—ISA/EPO—Aug. 30, 2013.

(Continued)

*Primary Examiner* — Thanh Le
(74) *Attorney, Agent, or Firm* — Michael S. Kramer (57) ABSTRACT

Power detectors with temperature compensation and having improved accuracy over temperature are disclosed. In an aspect of the disclosure, variations of a power detector gain over temperature is reduced by varying both the gate and drain voltages of MOS transistors within a power detector. In an exemplary design, an apparatus includes at least one MOS transistor, which receives an input signal, detects the power of the input signal based on a power detection gain, and provides an output signal indicative of the power of the input signal. The at least one MOS transistor is applied a variable gate bias voltage and a variable drain bias voltage in order to reduce variations of the power detection gain over temperature. At least one additional MOS transistor may receive a second variable gate bias voltage and provide the variable drain bias voltage for the at least one MOS transistor.

25 Claims, 4 Drawing Sheets

(56) References Cited

U.S. PATENT DOCUMENTS

| | | |
|---|---|---|
| 7,395,036 B2 * | 7/2008 | Akamine et al. ............ 455/126 |
| 7,672,648 B1 * | 3/2010 | Groe et al. ............... 455/127.2 |
| 7,970,364 B2 | 6/2011 | Mayer et al. |
| 8,089,313 B2 | 1/2012 | Chang et al. |
| 2004/0212434 A1 * | 10/2004 | Nagamori et al. ........... 330/285 |
| 2011/0095826 A1 | 4/2011 | Hadjichristos et al. |
| 2011/0221421 A1 | 9/2011 | Williams |
| 2012/0169424 A1 | 7/2012 | Pinarello et al. |

OTHER PUBLICATIONS

Zhou Y., et al., "A Low-Power Ultra-Wideband CMOS True RMS Power Detector", IEEE Transactions on Microwave Theory and Techniques, IEEE Service Center, Piscataway, NJ, US, vol. 55, No. 5, May 1, 2008, pp. 1052-1058, XP011207325, ISSN: 0018-9480.

* cited by examiner

POWER DETECTOR WITH TEMPERATURE COMPENSATION

The present application claims priority to provisional U.S. Application Ser. No. 61/654,655, entitled "POWER DETECTOR WITH TEMPERATURE COMPENSATION," filed Jun. 1, 2012, assigned to the assignee hereof and incorporated herein by reference in its entirety.

BACKGROUND

I. Field

The present disclosure relates generally to electronics, and more specifically to a power detector.

II. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the proper output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station.

A wireless device may include a power detector to measure the power of an RF signal. The power detector may provide an output signal that may be a square function of an input signal and may be referred to as a square law detector. The power detector may be implemented with complementary metal oxide semiconductor (CMOS) transistors and may use a square-law relationship between drain current versus gate voltage of CMOS transistors to convert input signal power to output current. The power detector is associated with a power detector gain, which is a conversion gain between the output current and the input signal power. The power detector gain may be proportional to electron mobility, which may be a function of temperature. Hence, the power detector gain would change over temperature, e.g., by up to 7 decibels (dB) for some integrated circuit (IC) processes. Variations of the power detector gain over temperature would adversely impact the accuracy of the power detector over temperature.

SUMMARY

Power detectors with temperature compensation and having improved accuracy over temperature are disclosed herein. These power detectors may also be compensated for variations in IC process, power supply voltage, etc.

In an aspect of the present disclosure, variations of a power detector gain over temperature may be reduced by varying both a gate voltage and a drain voltage of MOS transistors within a power detector. In an exemplary design, an apparatus (e.g., a wireless device or an IC) may include at least one MOS transistor that may receive an input signal, detect the power of the input signal based on a power detection gain, and provide an output signal indicative of the power of the input signal. The input signal may comprise an input RF signal, and the output signal may comprise an envelope signal indicative of the power of the input RF signal. The at least one MOS transistor may be applied a variable gate bias voltage and a variable drain bias voltage in order to reduce variations of the power detection gain over temperature. The apparatus may further include at least one additional MOS transistor coupled to the at least one MOS transistor. The at least one additional MOS transistor may be applied a second variable gate bias voltage and may provide the variable drain bias voltage for the at least one MOS transistor.

In another aspect of the present disclosure, a power detector gain of a power detector may be estimated, and compensation may be performed either prior to the power detector or after the power detector in order to account for variations of the power detector gain. In an exemplary design, an apparatus may include a power detector, a gain estimation circuit, and a signal compensation circuit. The power detector may receive an input signal and provide an output signal and may have a gain that is dependent on temperature. The gain estimation circuit may estimate the gain of the power detector. The signal compensation circuit may compensate the input signal and/or the output signal based on the estimated gain of the power detector.

Various aspects and features of the disclosure are described in further detail below.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Power detectors with temperature compensation and having improved performance are disclosed herein. These power detectors may also be compensated for variations in IC process, power supply voltage, etc. These power detectors may be used for various electronic devices such as wireless communication devices, smartphones, tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, the use of the power detectors in a wireless communication device is described below.

Figure 1:
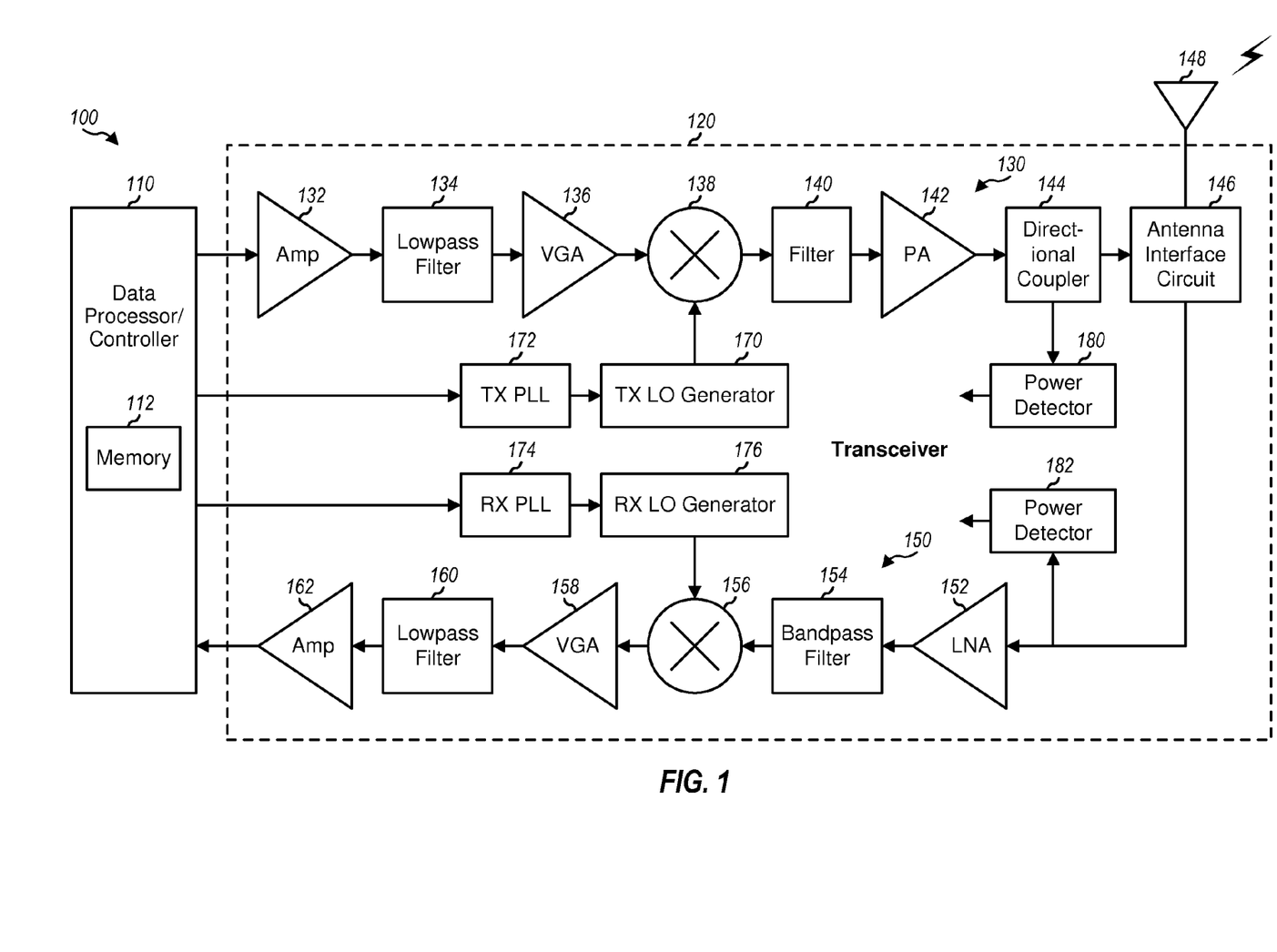
FIG. 1 shows a block diagram of a wireless communication device.

FIG. 1 shows a block diagram of an exemplary design of a wireless communication device 100. In this exemplary design, wireless device 100 includes a data processor/controller 110 and a transceiver 120 coupled to an antenna 148. Transceiver 120 includes a transmitter 130 and a receiver 150 that support bi-directional wireless communication. In general, wireless device 100 may include any number of transmitters and any number of receivers for any number of communication systems, any number of frequency bands, and any number of antennas.

In the transmit path, data processor 110 may process data to be transmitted and provide an analog output baseband signal to transmitter 130. Within transmitter 130, the analog output baseband signal may be amplified by an amplifier (Amp) 132, filtered by a lowpass filter 134 to remove images caused by digital-to-analog conversion, amplified by a variable gain amplifier (VGA) 136, and upconverted from baseband to RF by an upconverter 138. The upconverted signal may be filtered by a filter 140, amplified by a power amplifier (PA) 142, routed through a directional coupler 144 and an antenna interface circuit 146, and transmitted via antenna 148.

In the receive path, antenna 148 may receive signals from base stations and/or other transmitter stations and may provide a received RF signal, which may be routed through antenna interface circuit 146 and provided to receiver 150. Within receiver 150, the received RF signal may be amplified by a low noise amplifier (LNA) 152, filtered by a bandpass filter 154, and downconverted from RF to baseband by a downconverter 156. The downconverted signal may be amplified by a VGA 158, filtered by a lowpass filter 160, and amplified by an amplifier 162 to obtain an analog input baseband signal, which may be provided to data processor 110.

An LO generator 170 may generate a transmit LO signal for upconverter 138. An LO generator 176 may generate a receive LO signal for downconverter 156. Phase locked loops (PLLs) 172 and 174 may receive control information from data processor 110 and provide control signals to LO generators 170 and 172, respectively, to generate the transmit and receive LO signals at the proper frequencies.

A power detector 180 may be coupled to one or more ports of directional coupler 144 and may measure RF signal power at an input port, an output port, a coupled port, and/or a reflected port of directional coupler 144. A power detector 182 may be coupled to the input of LNA 152 (as shown in FIG. 1), or an output of LNA 152 (not shown in FIG. 1), or some point in the receive path. Power detector 182 may detect RF signal power of a received RF signal. The detected RF signal power from power detector 180 and/or 182 may be used to control the operation of transceiver 120.

FIG. 1 shows an exemplary design of transmitter 130 and receiver 150. In general, the conditioning of the signals in a transmitter and a receiver may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. All or a portion of transceiver 120 may be implemented on one or more analog ICs, RF ICs (RFICs), mixed-signal ICs, etc. For example, power detector 180 and/or 182 may be implemented on an RFIC.

Data processor/controller 110 may perform various functions for wireless device 100, e.g., processing for data being transmitted and data being received by wireless device 100. A memory 112 may store program codes and data for data processor 110. Data processor/controller 110 may be implemented on one or more application specific integrated circuits (ASICs) and/or other ICs.

A power detector with temperature compensation may be implemented in various manners. Some exemplary designs of such a power detector are described below.

Figure 2:
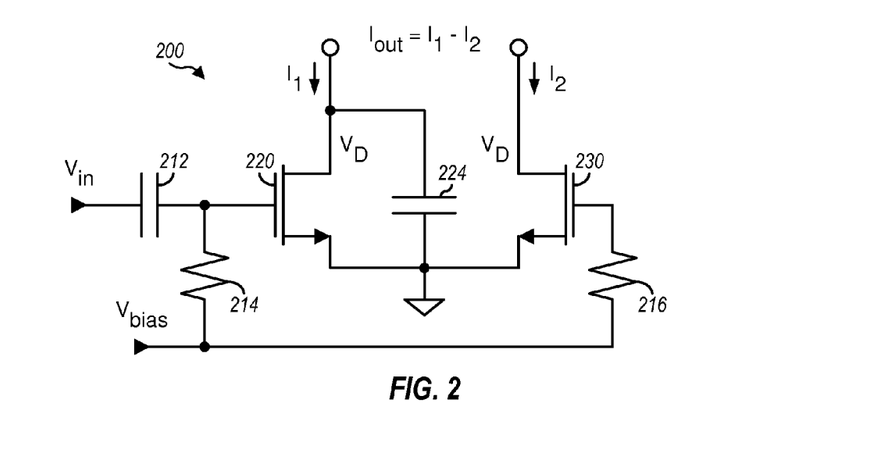
FIG. 2 shows a schematic diagram of a power detector.

FIG. 2 shows a schematic diagram of an exemplary design of a power detector 200. Power detector 200 includes a pair of N-channel metal oxide semiconductor (NMOS) transistors 220 and 230 coupled as a differential pair. NMOS transistor 220 has its source coupled to circuit ground, its gate coupled to one end of a resistor 214, and its drain providing a first output current ($I_1$). NMOS transistor 230 has its source coupled to circuit ground, its gate coupled to one end of a resistor 216, and its drain providing a second output current ($I_2$). The other ends of resistors 214 and 216 are coupled together and are applied a gate bias voltage ($V_{bias}$). An AC coupling capacitor 212 has one end receiving an input signal ($V_{in}$) and the other end coupled to the gate of NMOS transistor 220. A capacitor 224 is coupled between the drain of NMOS transistor 220 and circuit ground.

Power detector 200 receives the $V_{in}$ signal at the gate of NMOS transistor 220 and provides a differential output current ($I_{out}$) from the drains of NMOS transistors 220 and 230. A transfer function between the $I_{out}$ current and the square of the $V_{in}$ signal ($V_{in}^2$) may be expressed as:

$$\frac{d I_{out}}{d |V_{in}^2|} = \qquad \text{Eq (1)}$$

$$K_{pd} = \frac{1}{2} \cdot \frac{\mu_0(T)}{1 + \theta(V_{GS} + V_{th}(T))} \cdot C_{OX}(T) \cdot \frac{W}{L} \times (1 - \lambda \cdot V_{DS}),$$

where

T denotes temperature, $V_{GS}$ denotes a gate-to-source voltage of each of NMOS transistors 220 and 230, $V_{DS}$ denotes a drain-to-source voltage of each NMOS transistor, $V_{th}(T)$ denotes a threshold voltage of each NMOS transistor as a function of temperature, W and L are width and length, respectively, of each NMOS transistor, $\mu_0(T)$ denotes electron mobility as a function of temperature, $\theta(V_{GS}+V_{th}(T))$ denotes a function of $V_{GS}$ and $V_{th}(T)$, $C_{ox}(T)$ denotes oxide capacitance as a function of temperature, and $K_{pd}$ is a power detector gain of power detector 200.

A power detector gain may also be referred to as a gain or an effective gain of a power detector. A power detector gain may be dependent on a small-signal gain of gain transistors (e.g., NMOS transistors 220 and 230) and possibly other characteristics of a power detector.

Ideally, a power detector gain of a power detector is a fixed/constant value, and an output signal of the power detector is proportional to the square of an input signal of the power detector. However, as shown in equation (1), the power detector gain is dependent on several terms that are functions of temperature. These temperature-dependent terms include electron mobility $\mu_0(T)$, oxide capacitance $C_{ox}(T)$, threshold voltage $V_{th}(T)$, and function $\theta(V_{GS}+V_{th}(T))$. The power detector gain is also dependent on several terms that are dependent on IC process, including electron mobility $\mu_0(T)$, oxide capacitance $C_{ox}(T)$, threshold voltage $V_{th}(T)$, and width W and length L. The power detector gain changes with temperature because of the temperature-dependent terms, which then causes power detector 200 to have a temperature-dependent error. For example, the power detector gain decreases at higher temperature because electron mobility reduces with temperature. Furthermore, the threshold voltage decreases with temperature, e.g., by approximately 1 millivolt/degree (1 mV/deg). This results in an overdrive voltage of $V_{GS}-V_{th}(T)$ increasing with temperature due to reduction of the threshold voltage with temperature. The higher overdrive voltage with temperature results in an even greater reduction of electron mobility with temperature.

Temperature compensation may be performed for power detector 200 by varying the $V_{bias1}$ voltage to maintain approximately constant power detector gain over temperature. The $V_{GS}$ voltage of NMOS transistors 220 and 230 is determined by the $V_{bias1}$ voltage. The $V_{bias1}$ voltage may be varied as a function of temperature such that changes in the $\theta(V_{GS}+V_{th}(T))$ function due to the varied $V_{GS}$ voltage can account for changes to the terms $V_{th}(T)$, $\mu_0(T)$, and $C_{ox}(T)$ over temperature. For example, the $V_{bias1}$ voltage may be reduced at higher temperature, which may then reduce the overdrive voltage with temperature increase. The lower overdrive voltage may increase electron mobility at higher temperature, which may compensate for the reduction in electron mobility with temperature.

In an aspect of the present disclosure, variations of a power detector gain over temperature may be reduced by varying both a gate voltage and a drain voltage of MOS transistors within a power detector. The power detector gain may then be maintained approximately constant over temperature via the variable gate and drain voltages of the NMOS transistors.

Figure 3:
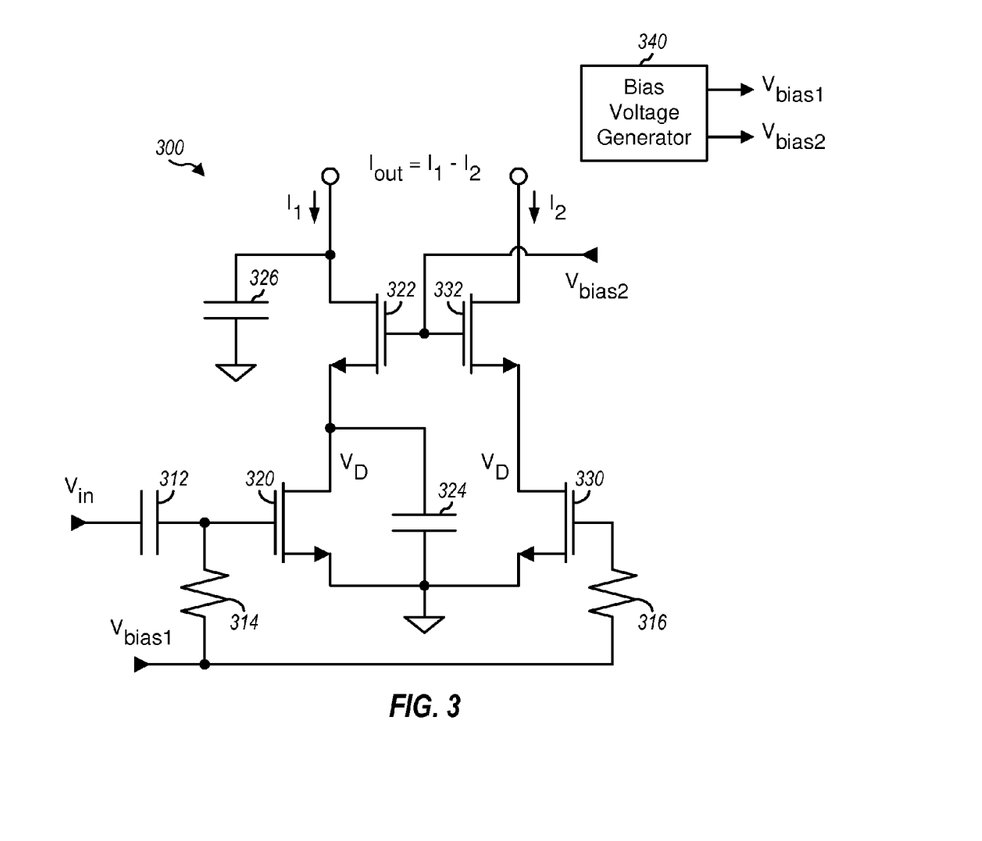
FIG. 3 shows a schematic diagram of a power detector with temperature compensation

FIG. 3 shows a schematic diagram of an exemplary design of a power detector 300 with temperature compensation by applying variable gate and drain voltages to maintain approximately constant power detector gain over temperature. Power detector 300 includes two gain NMOS transistors 320 and 330 coupled as a differential pair. NMOS transistor 320 has its source coupled to circuit ground, its gate coupled to one end of a resistor 314, and its drain coupled to the source of a cascode MOS transistor 322. NMOS transistor 330 has its source coupled to circuit ground, its gate coupled to one end of a resistor 316, and its drain coupled to the source of a cascode NMOS transistor 332. The other ends of resistors 314 and 316 are coupled together and are applied a first gate bias voltage ($V_{bias1}$). NMOS transistor 322 has its gate receiving a second bias voltage ($V_{bias2}$) and its drain providing a first output current ($I_1$). NMOS transistor 332 has its gate receiving the $V_{bias2}$ voltage and its drain providing a second output current ($I_2$). An AC coupling capacitor 312 has one end receiving an input signal ($V_{in}$) and the other end coupled to the gate of NMOS transistor 320. A capacitor 324 is coupled between the drain of NMOS transistor 320 and circuit ground. A capacitor 326 is coupled between the drain of NMOS transistor 322 and circuit ground. Capacitors 324 and 326 filter high frequency spurious components. A bias voltage generator 340 generates the $V_{bias1}$ voltage for NMOS transistors 320 and 330 and the $V_{bias2}$ voltage for NMOS transistors 322 and 332.

In an exemplary design, a first current source (not shown in FIG. 3) may be coupled between a power supply ($V_{DD}$) and the drain of NMOS transistor 322, and a second current source (also not shown in FIG. 3) may be coupled between the $V_{DD}$ supply and the drain of NMOS transistor 332. The first current source may provide a first bias current of $I_{bias1}$ to NMOS transistor 322, and the second current source may provide a second bias current of $I_{bias2}$ to NMOS transistor 332. The first bias current may be equal to the second bias current, so that $I_{bias1}=I_{bias2}$, or may be different from the second bias current. The $I_1$ output current may be equal to the difference between the $I_{bias1}$ current and the drain current of NMOS transistor 322. Similarly, the $I_2$ output current may be equal to the difference between the $I_{bias2}$ current and the drain current of NMOS transistor 332. Bias currents for NMOS transistors 320, 322, 330 and 332 may also be provided in other manners.

Power detector 300 receives the $V_{in}$ signal at the gate of NMOS transistor 320 and provides a differential output current ($I_{out}$) from the drains of NMOS transistors 322 and 332. A transfer function between the $I_{out}$ current and the square of the $V_{in}$ signal ($V_{in}^2$) may be expressed as shown in equation (1).

Temperature compensation may be performed for power detector 300 by varying the $V_{bias1}$ and $V_{bias2}$ voltages to maintain approximately constant power detector gain over temperature. The $V_{bias1}$ voltage affects function $\theta(V_{GS}+V_{th}(T))$, and the $V_{bias2}$ voltage affects function $(1+\lambda \cdot V_{DS})$. The $V_{bias1}$ and $V_{bias2}$ voltages may be varied as a function of temperature such that changes in the $\theta(V_{GS}+V_{th}(T))$ and $(1+\lambda \cdot V_{DS})$ functions can account for changes to the terms $V_{th}(T)$, $\mu_0(T)$, and $C_{ox}(T)$ over temperature.

The $V_{bias1}$ and $V_{bias2}$ voltages may be generated in various manners such that the power detector gain changes as little as possible over temperature. In an exemplary design, computer simulation may be performed to determine suitable $V_{bias1}$ and $V_{bias2}$ voltages at different temperature for a desired power detector gain. In another exemplary design, suitable $V_{bias1}$ and $V_{bias2}$ voltages may be determined at different temperatures for a desired power detector gain by empirical measurement of the power detector gain or a quantity related to the power detector gain. Suitable $V_{bias1}$ and $V_{bias2}$ voltages at different temperatures for a desired power detector gain may also be determined in other manners. A look-up table may store a set of $V_{bias1}$ and $V_{bias2}$ voltages (or corresponding circuit/control settings) for different temperatures for a desired power detector gain. The look-up table may also store multiple sets of $V_{bias1}$ and $V_{bias2}$ voltages for different temperatures for different power detector gains. Thereafter, the $V_{bias1}$ and $V_{bias2}$ voltages (or the corresponding circuit/control settings) for a desired power detector gain at a particular temperature may be retrieved from the look-up table. The $V_{bias1}$ and $V_{bias2}$ voltages may then be generated for power detector 300 based on the values retrieved from the look-up table.

In general, the $V_{bias1}$ and $V_{bias2}$ voltages may each be generated to be proportional to absolute temperature (PTAT), or complementary to absolute temperature (CTAT), or fixed over temperature. In an exemplary design, the $V_{bias1}$ voltage may be generated to decrease with temperature based on CTAT. In an exemplary design, the $V_{bias2}$ voltage may be generated to increase with temperature based on PTAT. In an exemplary design, the $V_{bias1}$ and $V_{bias2}$ voltages may be generated such that the bias current through each of NMOS transistors 320 and 330 is maintained within a particular range, e.g., between 240 microamperes (μA) to 440 μA. Limiting variations of the bias current may avoid possible issues related to voltage clipping and linearity of power detector 300.

Power detector 300 in FIG. 3 may have various advantages such as wideband operation (e.g., from 500 MHz to 2.7 GHz in one exemplary design), wide dynamic range, and low current consumption. However, the gain of power detector 300 may vary over IC process, power supply voltage, and temperature (PVT), especially over temperature. Compensation based on the variable $V_{bias1}$ and $V_{bias2}$ voltages may greatly reduce variations of the power detector gain over temperature.

Computer simulation was performed to compare variations of the power detector gain versus temperature for power detector 200 in FIG. 2 and power detector 300 in FIG. 3. The computer simulation showed that the power detector gain of power detector 300 varies less over temperature than the power detector gain of power detector 200.

In another aspect of the present disclosure, a power detector gain of a power detector may be estimated, and compensation may be performed either prior to the power detector or after the power detector in order to account for variations of the power detector gain. The power detector gain may vary with temperature, IC process, and power supply voltage and may be estimated on-chip with a gain estimation circuit.

Figure 4A:
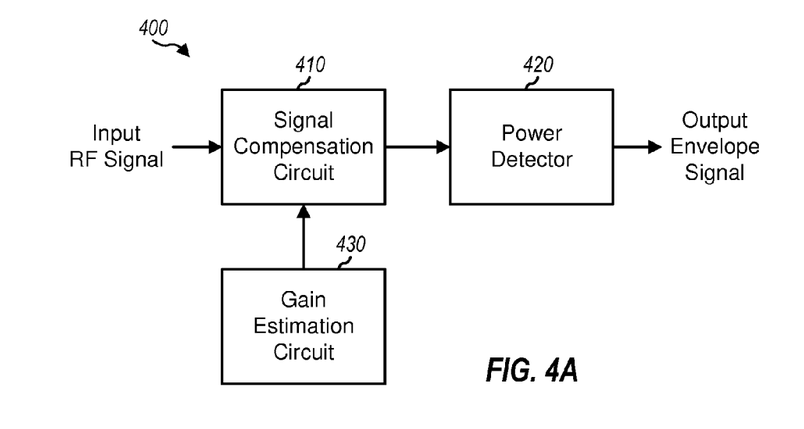
FIGS. 4A to 4C show three exemplary designs of a power detection module with compensation for temperature-dependent power detector gain.

FIG. 4A shows an exemplary design of a power detection module 400 with analog pre-detection compensation for temperature-dependent power detector gain. Power detection module 400 includes a signal compensation circuit 410, a power detector 420, and a gain estimation circuit 430. Signal compensation circuit 410 receives an input RF signal and an estimated gain ($K_{est}$) of power detector 420. Signal compensation circuit 410 compensates the input RF signal based on the estimated gain to account for variations of the power detector gain of power detector 420 and provides a compensated input RF signal. Power detector 420 measures the power of the compensated input RF signal and provides an output envelope signal indicative of the power of the input RF signal. Gain estimation circuit 430 estimates the power detector gain of power detector 420 and provides the estimated gain. Signal compensation circuit 410, power detector 420, and/or gain estimation circuit 430 may operate continuously. The envelope signal may be indicative of the instantaneous power of the input RF signal.

Figure 4B:
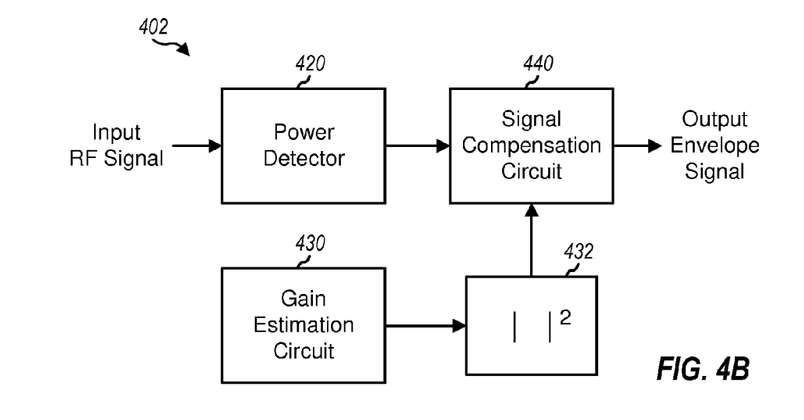

FIG. 4B shows an exemplary design of a power detection module 402 with analog post-detection compensation for temperature-dependent power detector gain. Power detection module 402 includes power detector 420, gain estimation circuit 430, and a signal compensation circuit 440. Power detector 420 measures the power of an input RF signal and provides an output envelope signal. Gain estimation circuit 430 estimates the power detector gain of power detector 420 and provides an estimated gain. A unit 432 receives and squares the estimated gain and provides a correction factor. Signal compensation circuit 440 receives the envelope signal and the correction factor, compensates the envelope signal based on the correction factor to account for variations of the power detector gain of power detector 420, and provides a compensated envelope power indicative of the instantaneous power of the input RF signal.

Figure 4C:
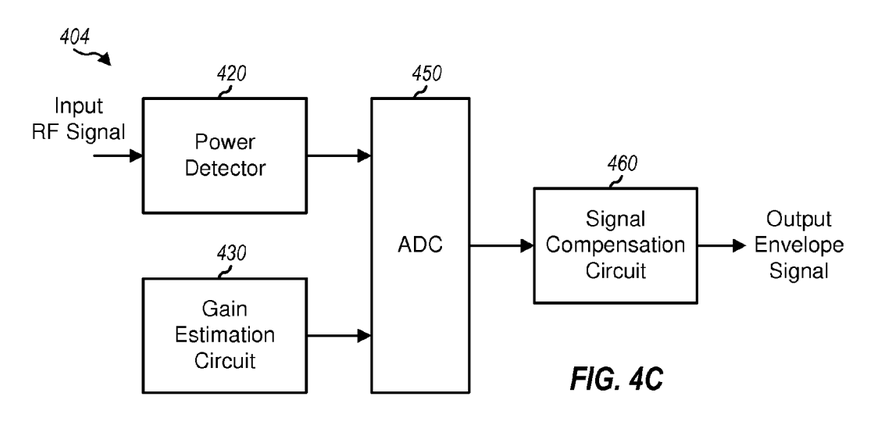

FIG. 4C shows an exemplary design of a power detection module 404 with digital post-detection compensation for temperature-dependent power detector gain. Power detection module 404 includes power detector 420, gain estimation circuit 430, an analog-to-digital converter (ADC) 450, and a signal compensation circuit 460. Power detector 420 measures the power of an input RF signal and provides an envelope signal. Gain estimation circuit 430 estimates the power detector gain of power detector 420 and provides an estimated gain. ADC 450 digitizes the envelope signal and provides a digitized envelope signal comprising samples. ADC 450 also digitizes the estimated gain and provides a digitized gain. Signal compensation circuit 460 receives the digitized envelope signal and the digitized gain. Signal compensation circuit 460 compensates the digitized envelope signal based on the digitized gain to account for variations of the power detector gain of power detector 420 and provides an output envelope power indicative of the instantaneous power of the input RF signal.

FIGS. 4A to 4C show three exemplary designs in which the temperature-dependent power detector gain of power detector 420 may be compensated. In the exemplary design shown in FIG. 4A, the input RF signal may be compensated based on the estimated gain to account for the temperature-dependent power detector gain of power detector 420. In the exemplary design shown in FIG. 4B, the envelope signal from power detector 420 may be compensated based on the estimated gain. In the exemplary design shown in FIG. 4C, the envelope signal from power detector 420 may be digitized, and the digitized envelope signal may be compensated based on the estimated gain. The temperature-dependent power detector gain of power detector 420 may also be compensated in other manners.

Figure 5:
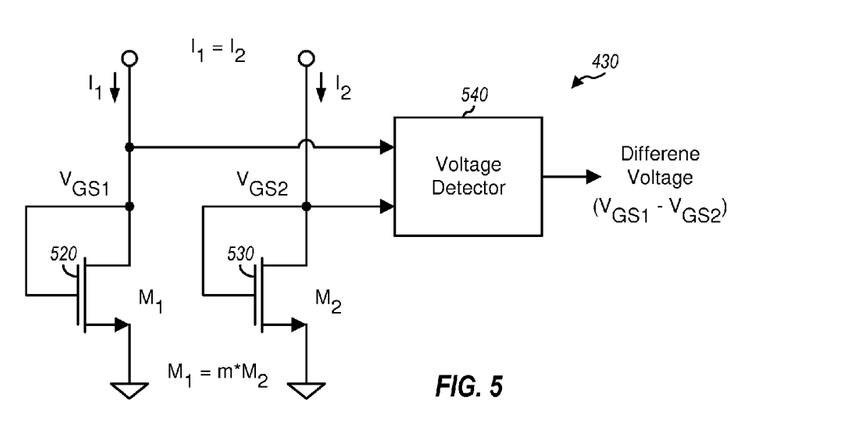
FIG. 5 shows an exemplary design of a gain estimation circuit.

FIG. 5 shows a schematic diagram of an exemplary design of gain estimation circuit 430 in FIGS. 4A to 4C. In this design, gain estimation circuit 430 includes NMOS transistors 520 and 530 and a voltage detector 540. NMOS transistor 520 is connected as a diode and has its source coupled to ground, its gate coupled to its drain, and its drain receiving a current of $I_1$. NMOS transistor 530 is also connected as a diode and has its source coupled to ground, its gate coupled to its drain, and its drain receiving a current of $I_2$. Voltage detector 540 has a first input coupled to the drain of NMOS transistor 520, a second input coupled to the drain of NMOS transistor 530, and an output providing the difference between the detected voltages at its two inputs.

An ideal transfer function between the drain current and the $V_{GS}$ voltage of an NMOS transistor may be expressed as:

$$I = K*(V_{GS} - V_{th})^2, \text{ and} \qquad \text{Eq (2)}$$

$$K = \frac{\mu_n \cdot C_{OX}}{2} \cdot \frac{W}{L} \qquad \text{Eq (3)}$$

Equations (2) and (3) apply to an NMOS transistor operating in a saturation region.

NMOS transistor 520 has a dimension of $M_1/L$, and NMOS transistor 530 has a dimension of $M_2/L$, where $M_1$ and $M_2$ denote the widths of NMOS transistors 520 and 530, respectively, and L denotes the length of each NMOS transistor. In an exemplary design, NMOS transistor 520 has a size that is m times the size of NMOS transistor 530, so that $M_1=m*M_2$, where m may be any value greater than 1. Furthermore, the same drain current $I_1=I_2$ may be applied to both NMOS transistors 520 and 530. In this design, the power detector gain may be estimated as follows:

$$K_{est} = \frac{k_a}{(V_{GS1} - V_{GS2})^2}, \text{ and} \qquad \text{Eq (4)}$$

$$k_a = \frac{I_2}{m} \cdot (\sqrt{m} - 1)^2, \qquad \text{Eq. (5)}$$

where $V_{GS1}$ and $V_{GS2}$ denote the gate-to-source voltages of NMOS transistors 520 and 530, respectively, $k_a$ denotes a scaling factor, and $K_{est}$ denotes the estimated gain of the power detector.

In another exemplary design, NMOS transistors 520 and 530 have the same size, so that $M_1=M_2$, and the $I_1$ current may be n times the $I_2$ current, so that $I_1=n*I_2$, where n may be any value greater than 1. In this design, the power detector gain may be estimated as follows:

$$K_{est} = \frac{k_b}{(V_{GS1} - V_{GS2})^2}, \text{ and} \qquad \text{Eq (6)}$$

$$k_b = I_2 \cdot (\sqrt{n} - 1)^2. \qquad \text{Eq (7)}$$

In yet another exemplary design, NMOS transistor 520 has a size that is m times the size of NMOS transistor 530, so that $M_1 = m*M_2$, and the $I_1$ current may be n times the $I_2$ current, so that $I_1 = n*I_2$. In this design, the power detector gain may be estimated as follows:

$$K_{est} = \frac{k_c}{(V_{GS1} - V_{GS2})^2}, \text{ and} \qquad \text{Eq (8)}$$

$$k_c = \frac{I_2}{m} \cdot (\sqrt{m*n} - 1)^2. \qquad \text{Eq (9)}$$

FIG. 5 shows an exemplary design of gain estimation circuit 430. A gain estimation circuit may also be implemented in other manners. For example, a gain estimation circuit may include (i) multiple (M) NMOS transistors coupled in a stack in place of NMOS transistor 520 and (ii) multiple (M) additional MOS transistors coupled in a stack in place of NMOS transistor 530. Each NMOS transistor may be diode-connected and may have its gate and drain coupled together. The difference between the drain voltages of the topmost NMOS transistors in the two stack may be detected and divided by M (or the number of NMOS transistors in each stack) to obtain a voltage difference, which may be used to estimate the power detector gain.

In an exemplary design, an apparatus (e.g., a wireless device, an IC, a circuit module, etc.) may include at least one MOS transistor (e.g., NMOS transistors 320 and 330 in FIG. 3) that may receive an input signal, detect the power of the input signal based on a power detection gain, and provide an output signal indicative of the power of the input signal. The input signal may comprise an input RF signal, and the output signal may comprise an envelope signal indicative of the power of the input RF signal. The at least one MOS transistor may be applied a variable gate bias voltage and a variable drain bias voltage in order to reduce variations of the power detection gain over temperature. The apparatus may further comprise at least one additional MOS transistor (e.g., NMOS transistors 322 and 332) coupled to the at least one MOS transistor. The at least one additional MOS transistor may be applied a second variable gate bias voltage and may provide the variable drain bias voltage for the at least one MOS transistor.

In an exemplary design, the at least one MOS transistor may comprise first and second NMOS transistors (e.g., NMOS transistors 320 and 322 in FIG. 3). The first NMOS transistor may have a source coupled to circuit ground, a gate receiving the variable gate bias voltage and the input signal, and a drain receiving the variable drain bias voltage. The second NMOS transistor may have a source coupled to circuit ground, a gate receiving the variable gate bias voltage, and a drain receiving the variable drain bias voltage.

In an exemplary design, the at least one additional MOS transistor may comprise third and fourth NMOS transistors (e.g., NMOS transistors 322 and 332 in FIG. 3). The third NMOS transistor may have a source coupled to the drain of the first NMOS transistor and a gate receiving a second variable gate bias voltage. The fourth NMOS transistor may have a source coupled to the drain of the second NMOS transistor and a gate receiving the second variable gate bias voltage. The third and fourth NMOS transistors may provide the variable drain bias voltage for the first and second NMOS transistors. The third and fourth NMOS transistors may also provide a differential output signal.

The apparatus may further comprise first and second capacitors. The first capacitor (e.g., capacitor 324 in FIG. 3) may be coupled between the drain of the first NMOS transistor and circuit ground. The second capacitor (e.g., capacitor 326 in FIG. 3) may be coupled between the drain of the third NMOS transistor and circuit ground.

In an exemplary design, the apparatus may further comprise a bias generator (e.g., bias generator 340 in FIG. 3). The bias generator may generate the variable gate bias voltage for the at least one MOS transistor, e.g., based on CTAT. The bias generator may also generate the second variable gate bias voltage for the at least one additional MOS transistor, e.g., based on PTAT. In one design, the bias generator may generate each variable gate bias voltage to be within a predetermined range of voltages. In another design, the bias generator may generate each variable gate bias to maintain the bias current of each MOS transistor within a predetermined range.

Figure 6:
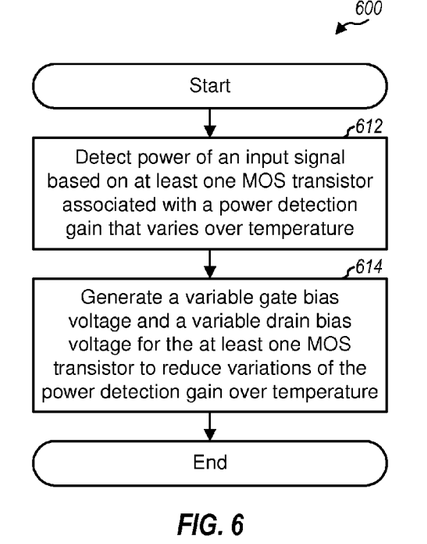
FIG. 6 shows a process for performing power detection.

FIG. 6 shows an exemplary design of a process 600 for performing power detection. Process 600 may be performed by a wireless device or some other apparatus. The power of an input signal may be detected based on at least one MOS transistor associated with a power detection gain that varies over temperature (block 612). A variable gate bias voltage and a variable drain bias voltage may be generated for the at least one MOS transistor to reduce variations of the power detection gain over temperature (block 614).

In one design of block 614, the variable drain bias voltage for the at least one MOS transistor may be generated with at least one additional MOS transistor, which may be applied a second variable gate bias voltage. In one design, the variable gate bias voltage for the at least one MOS transistor may be generated based on CTAT. In one design, the second variable gate bias voltage for the at least one additional MOS transistor may be generated based on PTAT. The variable gate bias voltage for the at least one MOS transistor and the second variable gate bias voltage for the at least one additional MOS transistor may be generated to be within a predetermined range of voltages and/or to maintain the bias current of each MOS transistor within a predetermined range.

In another exemplary design, an apparatus (e.g., a wireless device, an IC, a circuit module, etc.) may include a power detector, a gain estimation circuit, and a signal compensation circuit. The power detector (e.g., power detector 420 in FIGS. 4A to 4C) may receive an input signal and provide an output signal and may have a gain that is dependent on temperature. The gain estimation circuit (e.g., gain estimation circuit 430 in FIGS. 4A to 4C) may estimate the gain of the power detector. The signal compensation circuit (e.g., signal compensation circuit 410, 440 or 460) may compensate the input signal and/or the output signal based on the estimated gain of the power detector.

In an exemplary design, the gain estimation circuit may comprise first and second MOS transistors and a voltage detector. The first MOS transistor (e.g., NMOS transistor 520 in FIG. 5) may be coupled as a first diode and may have its source coupled to circuit ground and its gate and drain coupled together. The second MOS transistor (e.g., NMOS transistor 530 in FIG. 5) may be coupled as a second diode and may have its source coupled to circuit ground and its gate and drain coupled together. The voltage detector (e.g., voltage detector 540 in FIG. 5) may measure a first $V_{GS}$ voltage of the first MOS transistor and a second $V_{GS}$ voltage of the second MOS transistor. The gain of the power detector may be estimated based on the first and second $V_{GS}$ voltages. In one design, the first NMOS transistor may have a first size, and the second NMOS transistor may have a second size that is m times the first size, where m may be any value greater than one. In another design, the first and second NMOS transistors may have the same size.

In an exemplary design, the signal compensation circuit (e.g., signal compensation circuit 410 in FIG. 4A) may receive and compensate the input signal based on the estimated gain of the power detector and may provide a compensated input signal to the power detector. In another exemplary design, the signal compensation circuit (e.g., signal compensation circuit 440 in FIG. 4B or signal compensation circuit 460 in FIG. 4C) may receive and compensate the output signal based on the estimated gain of the power detector and provide a compensated output signal. The signal compensation circuit may perform analog compensation of the output signal from the power detector, e.g., as shown in FIG. 4B. Alternatively, the signal compensation circuit may perform digital compensation of the output signal from the power detector, e.g., as shown in FIG. 4C.

Figure 7:
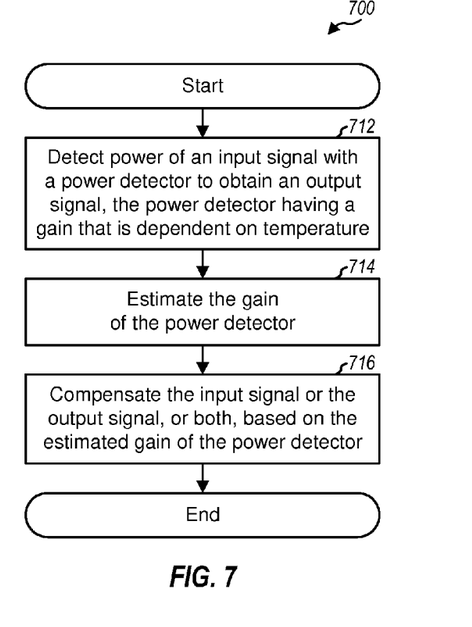
FIG. 7 shows a process for performing power detection with compensation.

FIG. 7 shows an exemplary design of a process 700 for performing power detection with compensation. Process 700 may be performed by a wireless device or some other apparatus. The power of an input signal may be detected with a power detector to obtain an output signal (block 712). The power detector may have a gain that is dependent on temperature. The gain of the power detector may be estimated (block 714). The input signal and/or the output signal may be compensated based on the estimated gain of the power detector (block 716).

In one design of block 714, a first $V_{GS}$ voltage of a first MOS transistor coupled as a first diode may be measured. A second $V_{GS}$ voltage of a second MOS transistor coupled as a second diode may also be measured. The gain of the power detector may be estimated based on the first and second $V_{GS}$ voltages, e.g., as shown in equation (4), (6), or (8).

In one design of block 716, the input signal may be compensated based on the estimated gain of the power detector to obtain a compensated input signal for the power detector. In another design, the output signal may be compensated (e.g., in the analog domain or the digital domain) based on the estimated gain of the power detector to obtain a compensated output signal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus for wireless communication, comprising:
at least one metal oxide semiconductor (MOS) transistor configured to receive an input signal at a first gate terminal, detect power of the input signal based on a power detection gain, and provide an output signal indicative of the power of the input signal;
a first node configured to receive and apply a variable gate bias voltage to the first gate terminal of the at least one MOS transistor and to a second gate terminal of the at least one MOS transistor,
wherein the variable gate bias voltage is applied to the first and second gate terminals of the at least one MOS transistor, in addition to the input signal received at the first gate terminal, to vary gate-to-source voltages of the at least one MOS transistor and to maintain approximately constant power detector gain over temperature; and
a second node configured to receive and apply a variable drain bias voltage to the at least one MOS transistor,
wherein the variable drain bias voltage is applied to the at least one MOS transistor provide additional control over the output signal.

2. The apparatus of claim 1, further comprising:
at least one additional MOS transistor coupled to the at least one MOS transistor; and
a third node configured to receive and apply a second variable gate bias voltage to gate terminals of the at least one additional MOS transistor,
wherein the second variable gate bias voltage varies gate-to-source voltages of the at least one additional MOS transistor to provide additional control over the variable drain bias voltage for the at least one MOS transistor.

3. The apparatus of claim 2, further comprising:
a bias generator configured to generate the variable gate bias voltage for the at least one MOS transistor and the second variable gate bias voltage for the at least one additional MOS transistor.

4. The apparatus of claim 3, the bias generator configured to generate the variable gate bias voltage for the at least one MOS transistor and the second variable gate bias voltage for the at least one additional MOS transistor to be within a predetermined range of voltages.

5. The apparatus of claim 3, the bias generator configured to generate the variable gate bias voltage for the at least one MOS transistor and the second variable gate bias voltage for the at least one additional MOS transistor to maintain a bias current of each MOS transistor within a predetermined range.

6. The apparatus of claim 1, the at least one MOS transistor comprising:
a first N-channel MOS (NMOS) transistor having a source coupled to circuit ground, a gate receiving the variable gate bias voltage and the input signal, and a drain receiving the variable drain bias voltage, and
a second NMOS transistor having a source coupled to circuit ground, a gate receiving the variable gate bias voltage, and a drain receiving the variable drain bias voltage, the first and second NMOS transistors providing a differential output signal.

7. The apparatus of claim 6, further comprising:
a third NMOS transistor having a source coupled to the drain of the first NMOS transistor and a gate receiving a second variable gate bias voltage; and
a fourth NMOS transistor having a source coupled to the drain of the second NMOS transistor and a gate receiving the second variable gate bias voltage, the third and fourth NMOS transistors providing the variable drain bias voltage for the first and second NMOS transistors.

8. The apparatus of claim 7, further comprising:
a first capacitor coupled between the drain of the first NMOS transistor and circuit ground; and
a second capacitor coupled between the drain of the third NMOS transistor and circuit ground.

9. A method of performing power detection, comprising:
detecting power of an input signal based on at least one metal oxide semiconductor (MOS) transistor associated with a power detection gain that varies over temperature,
wherein the input signal is received at a first gate terminal of the at least one MOS transistor;
generating and applying a variable gate bias voltage to the first gate terminal of the at least one MOS transistor through a first resistor and to a second gate terminal of the at least one MOS transistor through a second resistor,
wherein the variable gate bias voltage is applied to the first and second gate terminals of the at least one MOS transistor, in addition to the input signal received at the first gate terminal, to vary gate-to-source voltages of the at least one MOS transistor and to maintain approximately constant power detector gain over temperature;
generating and applying a variable drain bias voltage to the at least one MOS transistor to provide additional control to reduce variations of the power detection gain over temperature.

10. The method of claim 9, further comprising:
coupling at least one additional MOS transistor to the at least one MOS transistor;
receiving and applying a second variable gate bias voltage to gate terminals of the at least one additional MOS transistor,
wherein the second variable gate bias voltage varies gate-to-source voltages of the
at least one additional MOS transistor to provide additional control over the variable drain bias voltage for the at least one MOS transistor.

11. An apparatus for wireless communication, comprising:
a power detector configured to receive an input signal and provide an output signal, the power detector having a gain that is dependent on temperature;
a gain estimation circuit configured to estimate the gain of the power detector; and
a signal compensation circuit configured to compensate the input signal or the output signal, or both, based on the estimated gain of the power detector,
wherein compensation of the input signal is performed by applying a variable gate bias voltage to the power detector, in addition to the input signal, to vary gate-to-source voltages of transistors in the power detector,
wherein compensation of the output signal is performed by applying a variable drain bias voltage to the power detector to provide additional control over the output signal.

12. The apparatus of claim 11, the gain estimation circuit comprising:
a first metal oxide semiconductor (MOS) transistor coupled as a first diode, a second MOS transistor coupled as a second diode, and a voltage detector configured to measure a first gate-to-source voltage (VGS) of the first MOS transistor and a second VGS voltage of the second MOS transistor, wherein the gain of the power detector is estimated based on the first and second VGS voltages.

13. The apparatus of claim 12, the first MOS transistor comprising a first N-channel MOS (NMOS) transistor having a source coupled to circuit ground and a gate coupled to a drain of the first NMOS transistor, and the second MOS transistor comprising a second NMOS transistor having a source coupled to circuit ground and a gate coupled to a drain of the second NMOS transistor.

14. The apparatus of claim 11, the signal compensation circuit configured to receive and compensate the input signal based on the estimated gain of the power detector and provide a compensated input signal to the power detector.

15. The apparatus of claim 11, the signal compensation circuit configured to receive and compensate the output signal based on the estimated gain of the power detector and provide a compensated output signal.

16. The apparatus of claim 11, the signal compensation circuit configured to perform analog compensation of the output signal from the power detector.

17. A method of performing power detection, comprising:
detecting power of an input signal with a power detector to obtain an output signal, the power detector having a gain that is dependent on temperature;
estimating the gain of the power detector; and
compensating the input signal or the output signal, or both, based on the estimated gain of the power detector,
wherein the compensation of the input signal is performed by applying a variable gate bias voltage to the power detector, in addition to the input signal, to vary gate-to-source voltages of transistors in the power detector,
wherein compensation of the output signal is performed by applying a variable drain bias voltage to the power detector to provide additional control over the output signal.

18. The method of claim 17, wherein the estimating the gain of the power detector comprises
measuring a first gate-to-source voltage (VGS) of a first metal oxide semiconductor (MOS) transistor coupled as a first diode,
measuring a second VGS voltage of a second MOS transistor coupled as a second diode, and
estimating the gain of the power detector based on the first and second VGS voltages.

19. The method of claim 17, wherein the compensating the input signal or the output signal, or both, comprises compensating the input signal based on the estimated gain of the power detector to obtain a compensated input signal for the power detector.

20. The method of claim 17, wherein the compensating the input signal or the output signal, or both, comprises compensating the output signal based on the estimated gain of the power detector to obtain a compensated output signal.

21. An apparatus for wireless communication, comprising:
means for detecting power of an input signal based on a gain of a power detector to obtain an output signal, the power detector gain being dependent on temperature;
means for estimating the power detector gain; and
means for compensating the input signal or the output signal, or both, based on the estimated power detector gain,
wherein the means for compensating the input signal includes means for applying a variable gate bias voltage to the power detector, in addition to the input signal, to vary gate-to-source voltages of transistors in the power detector,
wherein the means for compensating the output signal means for applying a variable drain bias voltage to the power detector to provide additional control over the output signal.

22. The apparatus of claim 21, wherein the means for estimating the power detector gain comprises
means for measuring a first gate-to-source voltage (VGS) of a first metal oxide semiconductor (MOS) transistor coupled as a first diode,
means for measuring a second VGS voltage of a second MOS transistor coupled as a second diode, and
means for estimating the power detector gain based on the first and second VGS voltages.

23. The apparatus of claim 21, wherein the means for compensating the input signal or the output signal, or both, comprises means for compensating the input signal based on the estimated gain of the power detector to obtain a compensated input signal for the means for detecting power.

24. The apparatus of claim 21, wherein the means for compensating the input signal or the output signal, or both, comprises means for compensating the output signal based on the estimated gain of the power detector to obtain a compensated output signal.

25. A non-transitory computer-readable medium storing a computer program, the computer program comprising executable instructions that cause a computer to:
detect power of an input signal based on a power detector gain to obtain an output signal, the power detector gain being dependent on temperature;
estimate the power detector gain; and
compensate the input signal or the output signal, or both, based on the estimated power detector gain,
wherein the compensation of the input signal is performed by executable instructions that apply a variable gate bias voltage to the power detector, in addition to the input signal, to vary gate-to-source voltages of transistors in the power detector,
wherein compensation of the output signal is performed by executable instructions that apply a variable drain bias voltage to the power detector to provide additional control over the output signal.

* * * * *